(12) United States Patent
Hudson et al.

(10) Patent No.: US 6,603,299 B1
(45) Date of Patent: *Aug. 5, 2003

(54) FREQUENCY LOCKED LOOP SPEED UP

(75) Inventors: Brewster T. Hudson, Downingtown, PA (US); Anthony Eugene Zortea, Pipersville, PA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/165,018

(22) Filed: Jun. 7, 2002

Related U.S. Application Data

(62) Division of application No. 09/671,380, filed on Sep. 27, 2000, now Pat. No. 6,486,650.

(51) Int. Cl.[7] .............................................. G01R 23/02
(52) U.S. Cl. ..................... 324/76.53; 331/117; 331/1 R
(58) Field of Search .................................. 331/1 R, 1 A, 331/15, 16, 17, 40; 327/40, 159; 324/76.52, 76.53, 135, 613, 618, 620, 710

(56) References Cited

U.S. PATENT DOCUMENTS 5,304,955 A * 4/1994 Atriss et al. ................. 327/159
5,512,860 A * 4/1996 Huscroft et al. ............ 331/1 A

* cited by examiner

Primary Examiner—N. Le
Assistant Examiner—Vincent Q. Nguyen
(74) Attorney, Agent, or Firm—Michaelson & Wallace; Peter L. Michaelson; Janet M. Skafar

(57) ABSTRACT

A method in a communication circuit recovers a clock signal. A voltage controlled oscillator is initialized by supplying a predetermined.number of pulses to a charge pump coupled to the voltage controlled oscillator so as to initialize the voltage controlled oscillator to near an operating frequency upon power up of . the clock recovery circuit.

8 Claims, 4 Drawing Sheets

FREQUENCY LOCKED LOOP SPEED UP

This application is a division of patent application Ser. No. 09/671,380 filed Sep. 27, 2000 and entitled "Frequency Locked Loop Speed Up" now U.S. Pat. No. 6,486,650; which is incorporated by reference herein.

BACKGROUND

At the physical layer of a communication channel, integrated circuits transmit and receive signals over a transmission line. A single integrated circuit device can be used to both transmit and receive signals at each end of a transmission line. To recover the data within transmitted signal, the clock used to transmit the signal must be reproduced at the receiver. Typically, this is done with a clock recovery circuit.

At the receive end, an internal oscillator controlled by an independent variable, usually voltage, must be synchronized with the transmitter clock at the other end of the transmission line. Voltage controlled oscillators typically have a wide range of operation such as several hundred MHz. In a particular application, however, the oscillator is required to operate around less than 1% of a particular frequency. Thus, the oscillator has a much wider range than is required for transmission clock recovery circuits.

Because of the wide range of operation, a frequency lock loop is used to coarse adjust the voltage controlled oscillator. The frequency lock loop utilizes a local crystal oscillator similar to the one used to transmit the signal. A phase lock loop then performs a fine adjustment using the data signal itself to lock the voltage controlled oscillator to the transmitter frequency.

Under normal operation the time required to lock the voltage controlled oscillator at start up for a user is not too critical. But, when a manufacturer is required to reset/cycle power on a chip several times as part of functional testing of hundreds of chips, the time required to initialize the voltage controlled oscillator becomes significant. Thus, it is important to reduce voltage controlled oscillator initialization to reduce test time and improve productivity.

SUMMARY

In at least one implementation, a method is provided for testing a communication circuit having a clock recovery circuit. The method comprising initializing a voltage controlled oscillator to near an expected operating frequency upon power up of the clock recovery circuit by supplying a signal from an external tester.

DETAILED DESCRIPTION

Figure 1:
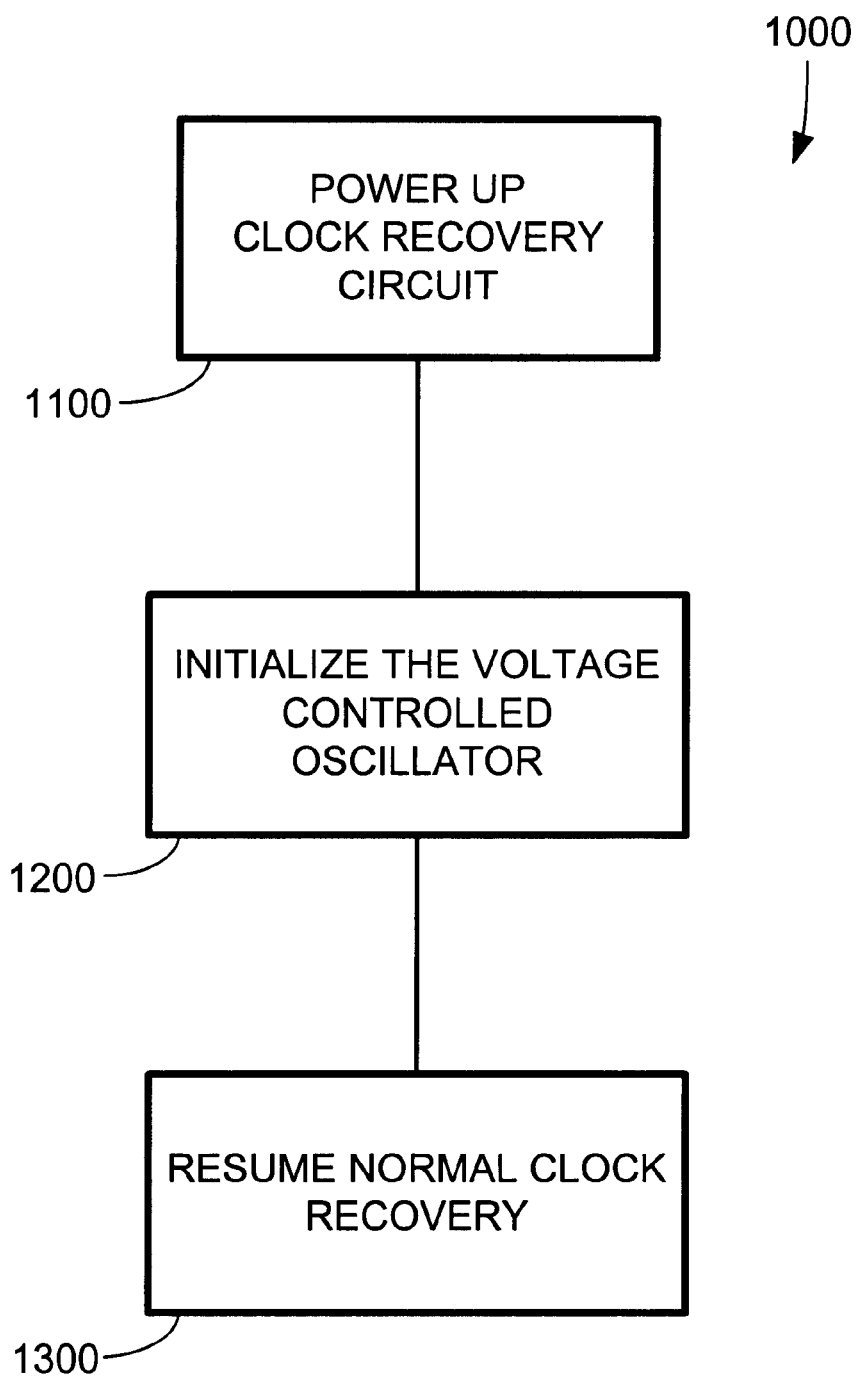
FIG. 1 illustrates a possible implementation in accordance with the method of the present invention.

Turning to FIG. 1, in at least one implementation, a method 1000 for initializing a voltage controlled oscillator of a clock recovery circuit during functional testing of a communication circuit is provided. With this method, after power up of the clock recovery circuitry a voltage controlled oscillator of the clock recovery circuit is initialized as represented by reference numbers 1100 and 1200 in FIG. 1. The voltage controlled oscillator is initialized to near its eventual operating frequency. Typically, the initialization step 1200 of the voltage controlled oscillator will supplant normal frequency lock loop and/or phase lock loop clock recovery. As such, the frequency locked loop and/or the phase lock loop may be decoupled from the voltage controlled oscillator during the initialization process 1200.

Figure 2:
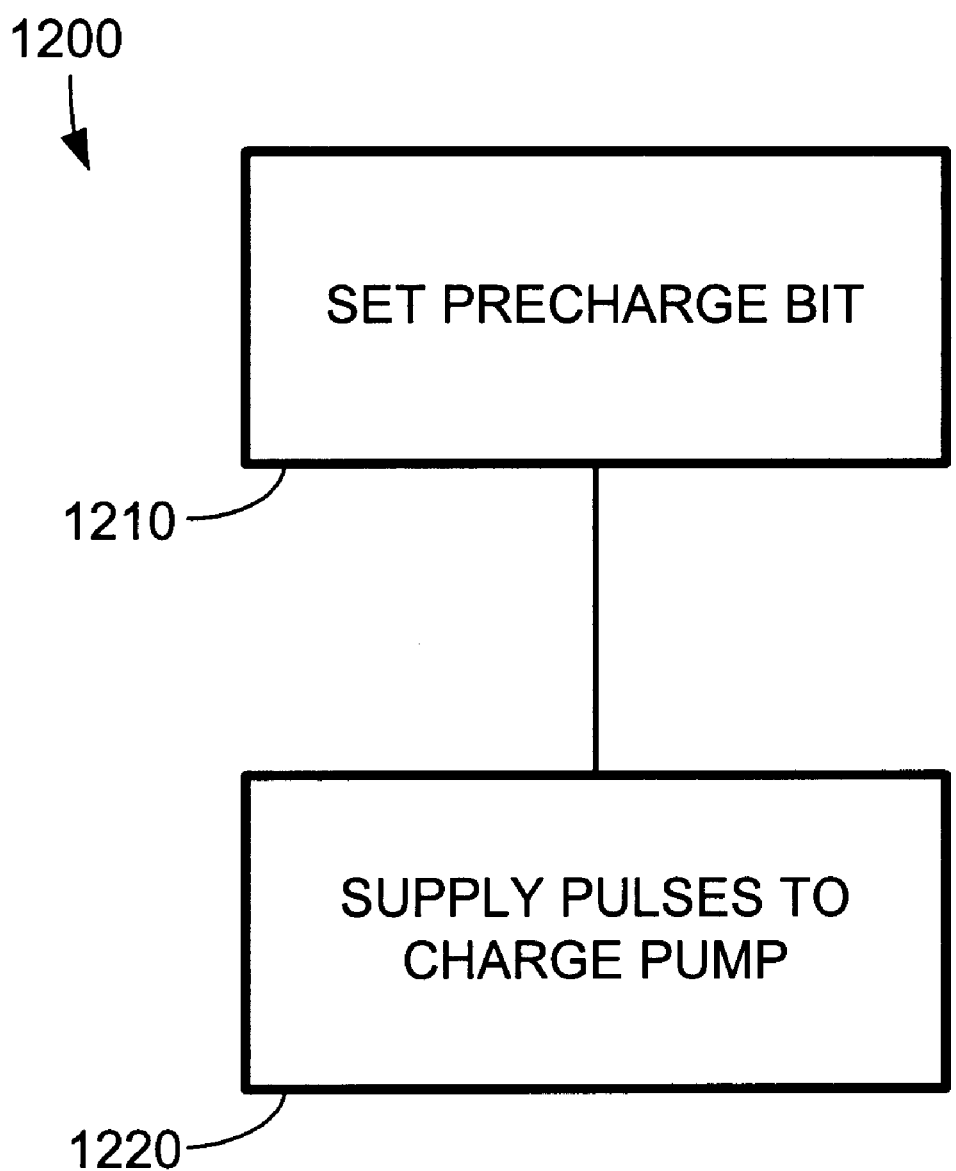
FIG. 2 illustrates a possible implementation for initialization in accordance with the method of the present invention.

Turning to FIG. 2, in one implementation, the step 1200 of initializing the voltage controlled oscillator includes at step 1210 communicating a precharge bit to the clock recovery circuit. For this, a precharge bit may be transmit from an external tester to the clock recovery. circuit to cause the clock recovery circuit to couple the initialization signal from the external tester to the voltage controlled oscillator. In the implementation of FIG. 2, initializing the voltage controlled oscillator comprises supplying a series of pulses to a charge pump 1220 which is coupled to the voltage controlled oscillator. A series of positive or up pulses are provided to rapidly charge the charge pump output to a level that brings the voltage control oscillator output to near its operating frequency.

After the pulses have been provided to the voltage controlled oscillator, the precharge bit is removed and normal frequency lock loop and phase lock loop recovery is resumed as illustrated in FIG. 1 at 1300.

Figure 3:
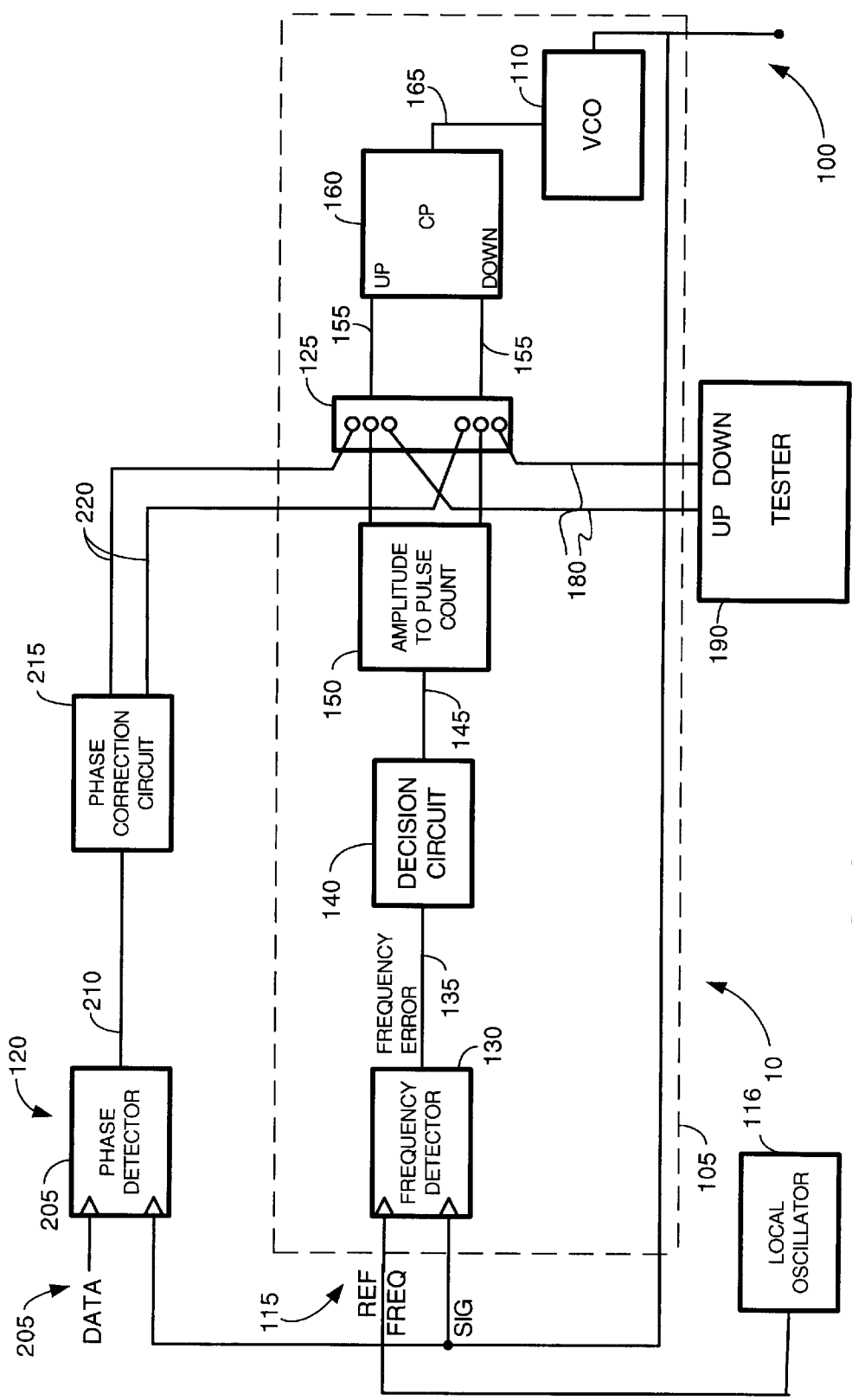
FIG. 3 shows a possible embodiment for implementation in accordance with the method of the present invention.

In some implementations, the method of the present invention may be utilized with a clock recovery circuit 10 as illustrated in FIG. 3. Clock recovery circuit 10 reproduces a transmitted clock signal at an output 100 for use by data recovery circuitry to recover data, typically digitally encoded, from a transmitted signal. To recover the transmitter clock signal, a frequency lock loop 105 is used to coarse tune a voltage controlled oscillator 110, while a phase lock loop 120 fine tunes the voltage control oscillator 110 to the transmitted clock frequency after the frequency lock loop 105 has completed coarse tuning.

As discussed above, initializing the voltage control oscillator 110 near the operating frequency may include providing an external initialization signal from a source external to the transmission circuitry and/or the chip. As such, the clock signal recovery circuit may be constructed so as to be capable of coupling an external initialization signal 180 to the voltage controlled oscillator 110 from a tester 190. This allows the voltage controlled oscillator 110 to be initialized after a reset/power down of the voltage controlled oscillator 110.

Such a capability allows a significant time savings during functional testing of devices, where there are often several power up/down or reset sequences during the functional testing of a single chip. When a large number of chips are being tested by automated testing procedures as part of the manufacturing process, the cumulative time savings can significantly improve production efficiencies.

A selector 125 may be provided to couple signals from one of the frequency lock loop 105, the phase lock loop 120, or the external source 190 to the voltage controlled oscillator 110. A multiplexer may be employed for this purpose. As will be discussed further below, the selector 125 couples signals to a charge pump 160, which in turn provides a voltage signal 165 to the voltage controlled oscillator 110.

The frequency lock loop 105 is capable of bringing the voltage controlled oscillator 110 close to the expected transmitter frequency using a reference clock signal 115., The reference clock signal 115 may be supplied by an on chip reference oscillator 116 used by transmission circuitry (not shown) which typically is located on the same chip. The on chip reference local oscillator 116 typically is a high precision local oscillator that provides a reference signal 115 having a frequency close to the reference local oscillator frequency used by the chip that transmitted the data signal.

In the embodiment of FIG. 3, the frequency lock loop 105 comprises a frequency detector 130 to provide a frequency error signal 135 derived by comparing the reference signal 115 and voltage control oscillator output 100. This may be accomplished by counting successive pulses and comparing the results over a selected time period. The error signal 135 may be provided to a decision circuit 140 which evaluates the frequency error and outputs a correction signal 145 corresponding to the amplitude and direction of frequency error 135.

Figure 4:
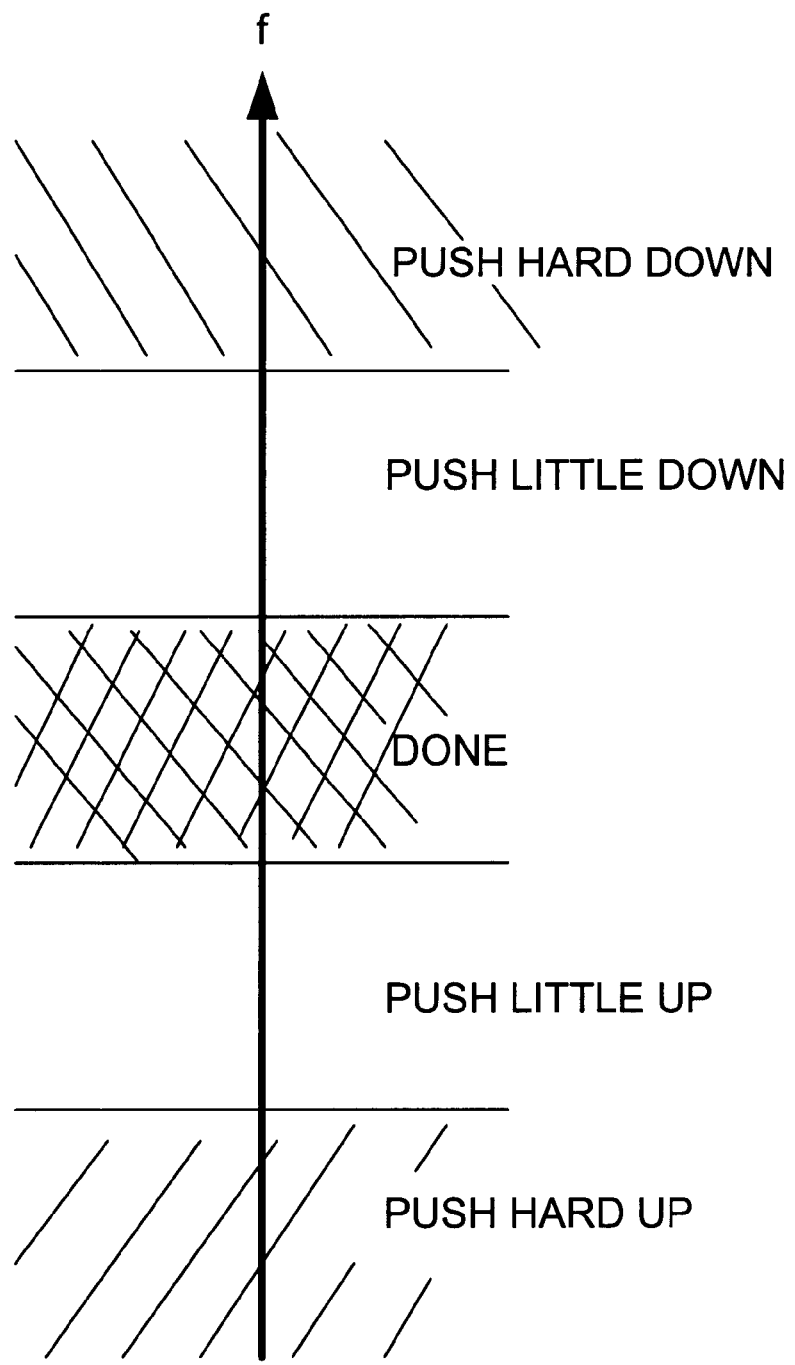
FIG. 4 shows a possible implementation in accordance with the method of the present invention.

For example, in one embodiment, the decision circuit 140 outputs a three bit word indicating the magnitude and direction to drive the voltage controlled oscillator 110. In such an embodiment, when the frequency error signal 135 is within a certain preselected range indicating that the voltage controlled oscillator 110 is close to the frequency of the reference signal 115, the correction signal 145 indicates that no correction is necessary from the frequency lock loop 105. FIG. 4 shows a possible implementation of such an embodiment.

In the implementation illustrated in FIG. 4, the decision circuit 140 provides a three bit correction signal 145 in response to the error signal 135. The correction signal 145 indicates whether the voltage controlled oscillator 110 should be provided with a large or small correction signal, i.e., push hard or push little, and which direction to correct, either up or down in frequency. Further, the decision circuit 140 indicates when no correction is necessary indicating the frequency lock loop 105 is done. Indication that the frequency lock loop 105 has brought the frequency to within the desired range may be communicated to the selector 125 so that phase lock loop signals rather than frequency lock loop 105 signals are coupled to the voltage control oscillator 110.

The correction signal 145 is supplied to an amplitude-to-pulse count circuit 150, which outputs a set of either up or down correction pulses 155 to the charge pump 160. The charge pump 160 supplies a voltage signal 165 to control the voltage control oscillator 110.

After the frequency lock loop 105 has brought the output signal 100 of the voltage controlled oscillator 110 close to the frequency of the reference frequency 115 the phase lock loop 120 is utilized to fine tune the recovered clock signal 100.

The phase lock loop 120 can be utilized to synchronize the phase of the voltage control oscillator output signal 100 with the clock signal from an incoming data signal 200. Possible methods and apparatus for phase lock loop clock recovery are disclosed in U.S. Pat. application Ser. No. 09/019,949 by Zortea et al., filed on Feb. 6, 1998, entitled DIGITAL CLOCK/DATA SIGNAL RECOVERY METHOD AND APPARATUS, issued as U.S. Pat. No. 6,389,090 on May 14, 2002, herein incorporated by.reference in its entirety.

In one embodiment, a phase detector 205 provides phase error signals 210 based on a comparison of the detected transmission clock signal embedded in the received data signal 200 and the voltage control oscillator output 100. Phase correction signals 220 are generated by phase correction circuitry 215. The phase correction signals 220 (either up or down pulses) are provided to the selector 125 for coupling to the voltage controlled oscillator 110 via the charge pump 160.

The clock recovery circuit 10 is constructed to allow a source of initialization signals. 180 external to the clock recovery circuit 10 to be provided to the selector 125. Shown in FIG. 3, the external signals 180 are provided by a tester 190. Upon power up of the clock recovery circuit 10, the tester 190 supplies a precharge test bit to the clock recovery circuit 10 indicating that the tester 190 will control precharging of the charge pump 160 to initialize the voltage control oscillator 110.

The selector 125 is used to supplant the normal frequency lock loop 105 correction signals 145 to the charge pump 160 and allows the tester 190 to provide a series of up pulses via the selector 125 to the charge pump 160. This permits the tester to follow each reset with a fast burst of pulses to the "UP" terminal of the charge pump 160 to quickly initialize or precharge the charge pump 160 to drive the voltage control oscillator 110 quickly to the vicinity of the desired frequency. The tester 190 provides a fixed number pulses based on an empirical average. After application of the precharge pulses, the precharge test bit is cleared allowing normal control of the frequency and phase lock loops to resume.

Without the initialization signal 180, the voltage controlled oscillator 110 is provided with a small predetermined number of pulses corresponding to each zone in FIG. 4. As such, several times after power up, the charge pump 160 is provided with a predetermined number of pulses for the particular zone and the response sampled and evaluated. This process is repeated several times in the push up hard zone as the oscillator is brought over its large operating range to near a desired operating point.

By providing the initialization signal, it is possible to reduce the initialization time of the voltage controlled oscillator from about 40 milliseconds to about 8 milliseconds. Although typically not critical during ordinary power up by a user, it is contemplated that initialization of the voltage controlled oscillator could be employed in such situations in accordance with the teachings herein. During functional testing of large quantities of chips, however, initialization of the voltage controlled oscillator as described herein results in improved production efficiencies, thus reducing the cost to manufacture devices.

While the preferred methods and embodiments of the present invention have been described in detail above, many changes to these embodiments may be made without departing from the true scope and teachings of the present invention, The present invention, therefore, is limited only as claimed below and the equivalents thereof.

What is claimed is:

1. A method in a communication circuit for recovering a clock signal, the method comprising initializing a voltage controlled oscillator by supplying a predetermined number of pulses to a charge pump coupled to the voltage controlled oscillator so as to initialize the voltage controlled oscillator to near an operating frequency upon power up of the clock recovery circuit, wherein the predetermined number of pulses are supplied external from the communication circuit.

2. The method of claim 1 comprising recovering the clock signal using a frequency lock loop responsive to a local oscillator.

3. The method of claim 2 wherein recovering the clock signal further comprises using a phase lock loop responsive to a transmitted data signal.

4. The method of claim 3 wherein initializing the voltage controlled oscillator comprises supplying the predetermined number of pulses to the charge pump as part of automated functional testing of the communication circuit.

5. The method of claim 1 wherein recovering the clock signal comprises coupling to the voltage controlled oscillator a signal from an external tester followed by at least one of a signal from the frequency lock loop circuit or a signal from the phase lock loop circuit.

6. The method of claim 5 wherein recovering the clock signal comprises coupling to the voltage controlled oscillator a signal from the external tester followed by a signal from the frequency lock loop circuit followed by a signal from the phase lock loop circuit.

7. The method of claim 1 wherein the pulses are up pulses.

8. The method of claim 1 wherein the predetermined number of pulses are supplied to the charge pump via a selector.

* * * * *